(12) United States Patent
Yoshikawa et al.

(10) Patent No.: US 7,714,269 B2
(45) Date of Patent: May 11, 2010

(54) LIGHT RECEIVING CIRCUIT

(75) Inventors: Kei Yoshikawa, Kumamoto (JP);
Ryusuke Shibata, Kumamoto (JP);
Tokio Sawataishi, Kanagawa (JP);
Nobuo Nagano, Kanagawa (JP); Koichi Iguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 224 days.

(21) Appl. No.: 12/068,081

(22) Filed: Feb. 1, 2008

(65) Prior Publication Data
US 2008/0197890 A1    Aug. 21, 2008

(30) Foreign Application Priority Data
Feb. 16, 2007    (JP) ............ 2007-036782

(51) Int. Cl.
*H01J 40/14*    (2006.01)
(52) U.S. Cl. ................ 250/214 R; 250/214.1; 315/291
(58) Field of Classification Search ........... 315/209 R, 315/224, 226, 241 P, 245, 291, 307; 250/214 A, 250/214 AG, 214 R, 214.1
See application file for complete search history.

(56) References Cited
U.S. PATENT DOCUMENTS
7,071,455 B2* 7/2006 Irie .............. 250/214 R
7,211,780 B2* 5/2007 Nishiyama ........... 250/214 R
7,265,333 B2* 9/2007 Ichino et al. .......... 250/214 R

FOREIGN PATENT DOCUMENTS
JP   2002-217649    8/2002

\* cited by examiner

*Primary Examiner*—Douglas W Owens
*Assistant Examiner*—Jimmy T Vu
(74) *Attorney, Agent, or Firm*—McGinn IP Law Group, PLLC (57) ABSTRACT

A light receiving circuit according to the present invention includes a current control voltage generation circuit 10 outputting control voltages Vcont1 and Vcont2, a first current adjusting circuit 11 generating a first output current Io1 by regulating a first input current Ii1 depending on a voltage difference of the control voltages Vcont1 and Vcont2, the first input current Ii1 generated by adding a first reference current Ia1 and an input current Ipd, a second current adjusting circuit 12 generating a second output current Io2 by regulating a second reference current Ia2 depending on the voltage difference of the control voltages Vcont1 and Vcont2, and a current voltage conversion circuit 13 generating a first output voltage Vo1 by converting the first output current Io1 to voltage based on a first resistance Rf1 and generating a second output voltage Vo2 by converting the second output current Io2 to voltage based on a second resistance Rf2.

9 Claims, 10 Drawing Sheets

PRIOR ART

PRIOR ART

Fig. 7

PRIOR ART

Fig. 8

PRIOR ART

Fig. 9

PRIOR ART

Fig. 10

PRIOR ART

LIGHT RECEIVING CIRCUIT

BACKGROUND OF THE INVENTION

1. Field of the Invention

The present invention relates to a light receiving circuit, and more particularly, to a light receiving circuit whose gain can be changed.

2. Description of Related Art

An optical disk device recording or reproducing data to an optical disk media such as CDs or DVDs has recently become widespread. In the optical disk device, laser beam output from a laser diode is reflected by an optical disk media and the reflected beam is converted to a control signal in a light receiving circuit. The light receiving circuit converts the light to current in the photo diode and current is converted to voltage in a current voltage conversion circuit. In other words, voltage converted by the light receiving circuit is the control signal and the optical disk device records and reproduces data based on the control signal.

However, in the optical disk device, there are characteristic variations of the laser diode and the photo diode and structural variations of the assembled optical system. Therefore, in the light receiving circuit, it is needed to successively change the gain in the current voltage conversion part in order to compensate the variations. In order to satisfy this need, there is proposed a light receiving circuit whose gain can be changed. A circuit diagram showing one example of the related light receiving circuit (hereinafter this example is referred to as first related art) is shown in FIG. 6.

Figure 6:
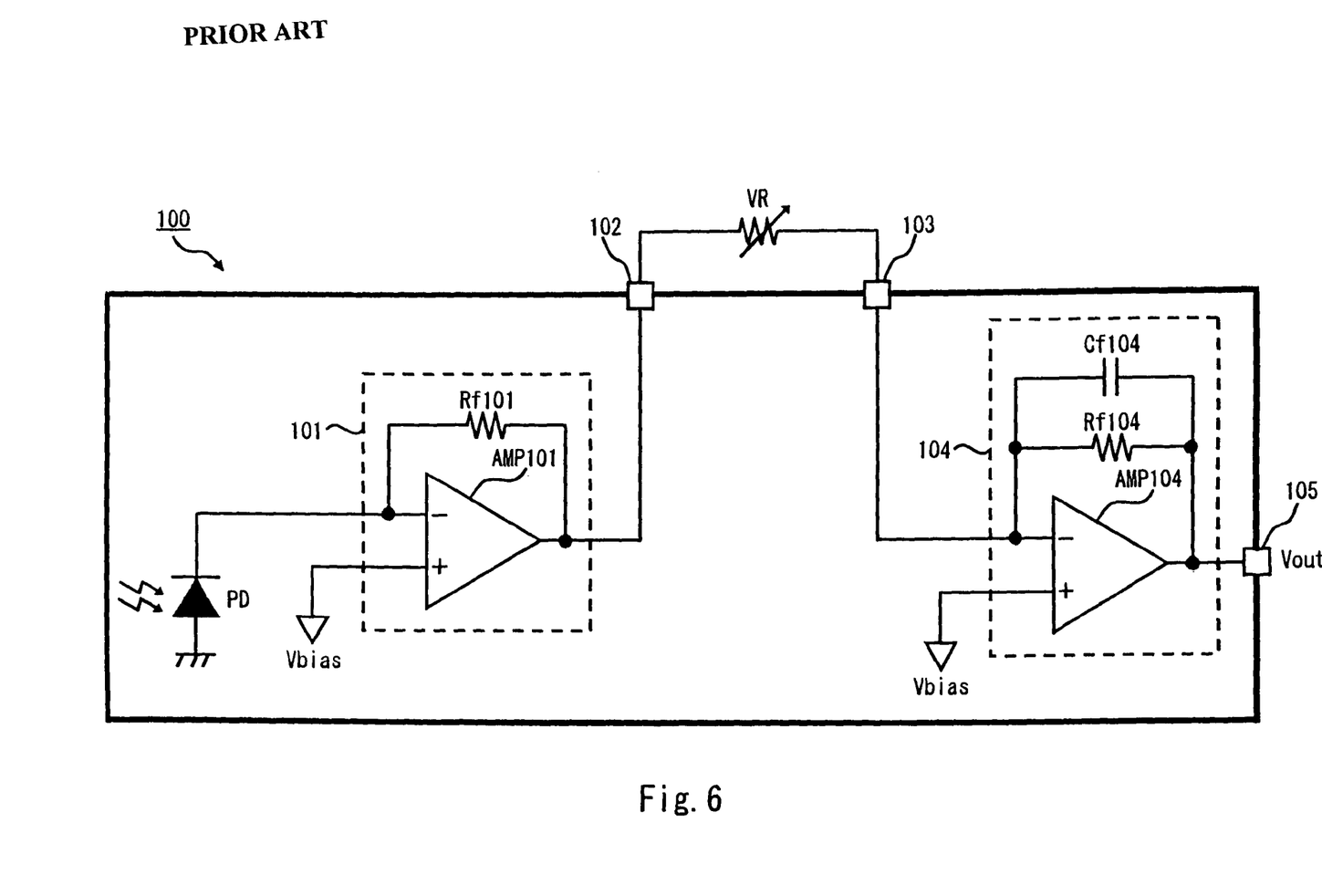
FIG. 6 is a circuit diagram of the light receiving circuit according to a first related art.

As shown in FIG. 6, a light receiving circuit 100 includes a current-voltage conversion circuit 101, a variable resistor VR, and a voltage amplification circuit 104. In the current-voltage conversion circuit 101, current generated by a photo diode PD according to the receiving amount is converted to voltage by a feedback resistor Rf101. Then the voltage amplification circuit 104 amplifies the voltage value output from the current-voltage conversion circuit 101 according to the ratio of the resistance value of the variable resistor VR to the resistance value of a feedback resistor Rf104. The voltage value output from the voltage amplification circuit 104 is transmitted to another circuit block as a control signal, which is not shown in the drawing.

Figure 7:
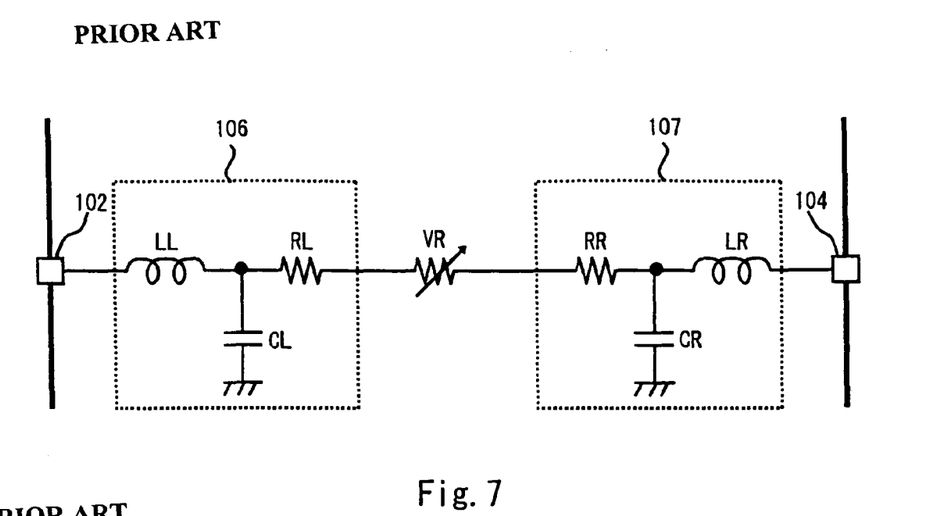
FIG. 7 is an equivalent circuit diagram of an element that is parasitic in a wiring connecting a light-voltage conversion circuit and a voltage amplification circuit in the light receiving circuit according to the first related art.

As stated above, in the first related art, it is possible to adjust the gain of the light receiving circuit by changing the resistance value of the variable resistor VR. However, the variable resistor VR connecting the current-voltage conversion circuit 101 and the voltage amplification circuit 104 is externally provided. Therefore, these two circuits and the variable resistor VR are needed to be connected through a wiring or a frame. FIG. 7 shows a schematic view of a parasitic component of the wiring and the frame. In the example shown in FIG. 7, a parasitic component 106 includes an inductor LL, a resistor RL, and a capacitor CL, and a parasitic component 107 includes an inductor LR, a resistor RR, and a capacitor CR. These parasitic components have constant value regardless of the resistance value of the variable resistor VR. Therefore, when the gain is adjusted by the resistance value of the variable resistor VR, ringing may occur in the signal that is transmitted depending on the resistance value of the variable resistor VR. Peak may also occur in the frequency characteristic of the signal.

Figure 8:
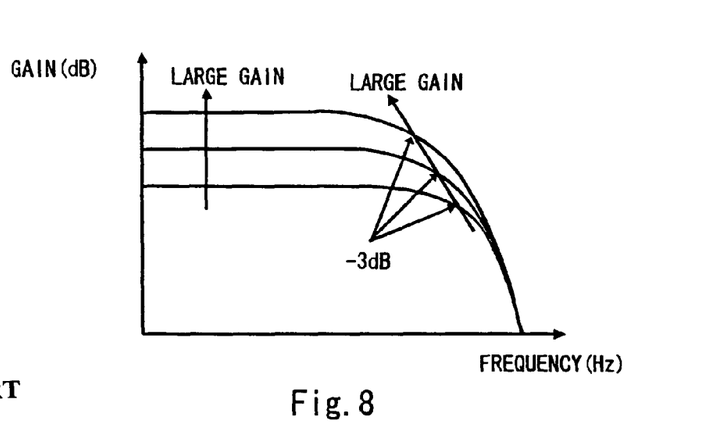
FIG. 8 is a graph showing a gain dependency of a frequency characteristic of the light receiving circuit according to the first related art.
Figure 9:
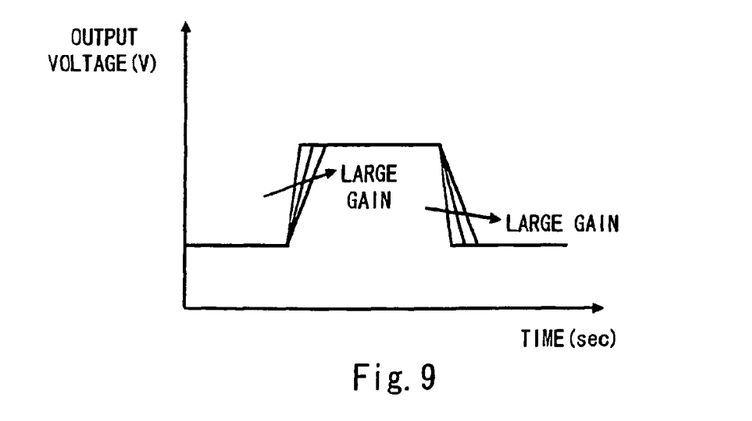
FIG. 9 is a graph showing the gain dependency of rising and falling characteristics of the signal of the light receiving circuit according to the first related art.
Figure 10:
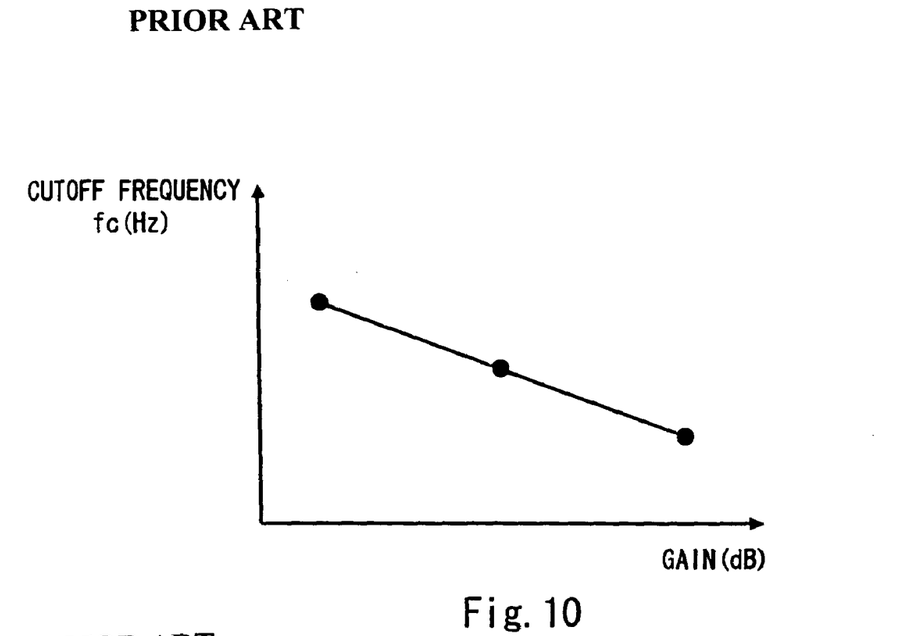
FIG. 10 is a graph showing the gain dependency of a cutoff frequency of the light receiving circuit according to the first related art.
Figure 11:
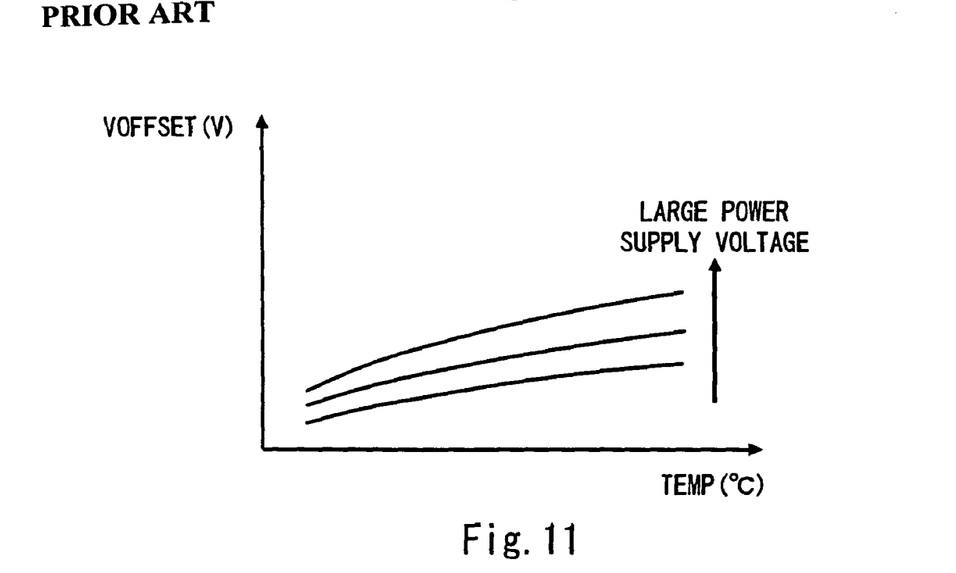
FIG. 11 is a graph showing a power dependency and a temperature dependency of an output offset voltage in the light receiving circuit according to the first related art.

Moreover, there is a problem that the characteristics of the voltage amplification circuit other than the gain may be changed due to the difference of the resistance value of the variable resistor VR. For example, as shown in FIG. 8, when the resistance value of the variable resistor VR is made smaller and the gain larger, the upper limit of the frequency of the signal that can be transmitted with keeping the signal gain constant is made lower as the gain increases. Further, as shown in FIG. 9, the rising time or falling time of the signal changes. As shown in FIG. 10, a cutoff frequency of the signal that is transmitted is made smaller as the gain increases. The change in the characteristic of the voltage amplification circuit 104 is due to the change of the frequency characteristics of the circuit because the resistance value of the variable resistor VR is changed even though the feedback capacitor Cf104 connected to the feedback resistance Rf104 in parallel in the amplification circuit AMP104 is constant. Further, in the light receiving circuit 100, the characteristics of the amplification circuit 104 fluctuates the output offset voltage according to power supply voltage and temperature. An example of the change in the output offset voltage is shown in FIG. 11. The change of the output offset voltage may be different from the fluctuation shown in FIG. 11 depending on the circuit configurations.

Figure 12:
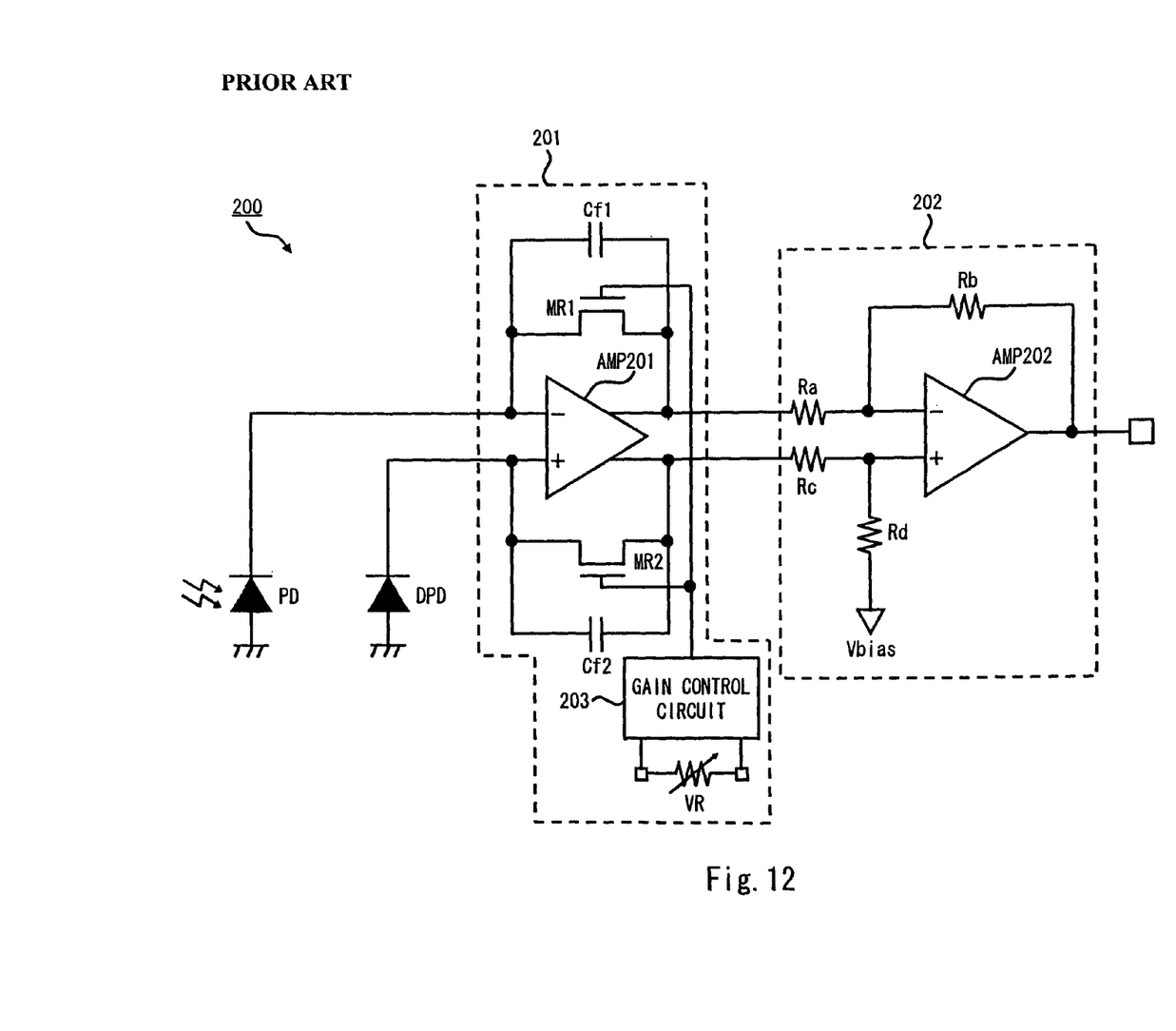
FIG. 12 is a circuit diagram of the light receiving circuit according to a second related art.

As another example of such a light receiving circuit, a light receiving circuit 200 shown in FIG. 12 is suggested (hereinafter this light receiving circuit is called second related art). The light receiving circuit 200 includes a photo diode PD and a dummy photo diode DPD. Then current generated by the photo diode PD is converted to a first voltage and current generated by the dummy photo diode DPD is converted to a second voltage by a current voltage conversion circuit 201. In this case, the current voltage conversion of the first voltage is performed through a variable resistor formed by an MOS transistor MR1 and the current voltage conversion of the second voltage is performed through an MOS transistor MR2. Then a difference of the first voltage and the second voltage is amplified by a voltage amplifier 202 in order to obtain a final signal.

In the light receiving circuit 200, the problem due to the parasitic component of the wiring and the frame as in the first related art does not occur. However, in the light receiving circuit 200, voltage applied to the gates of the MOS transistors MR1 and MR2 is controlled in the gain control circuit 203 so as to change the resistance of conduction state between source and drain of the MOS transistors MR1 and MR2 (hereinafter this resistance is called ON resistance). Thus, the light receiving circuit 200 changes the gain. Thus the problem due to the gain of the voltage amplifier as in the first related art can be solved. However, even though the resistance values of the MOS transistors MR1 and MR2 of the current voltage conversion circuit 201 are changed, the feedback capacitor (or parasitic capacitor) connected to the MOS transistors in parallel does not change. Therefore, even in the second related art, the change in the frequency characteristics as shown in FIGS. 8 to 10 still causes the problem.

Figure 13:
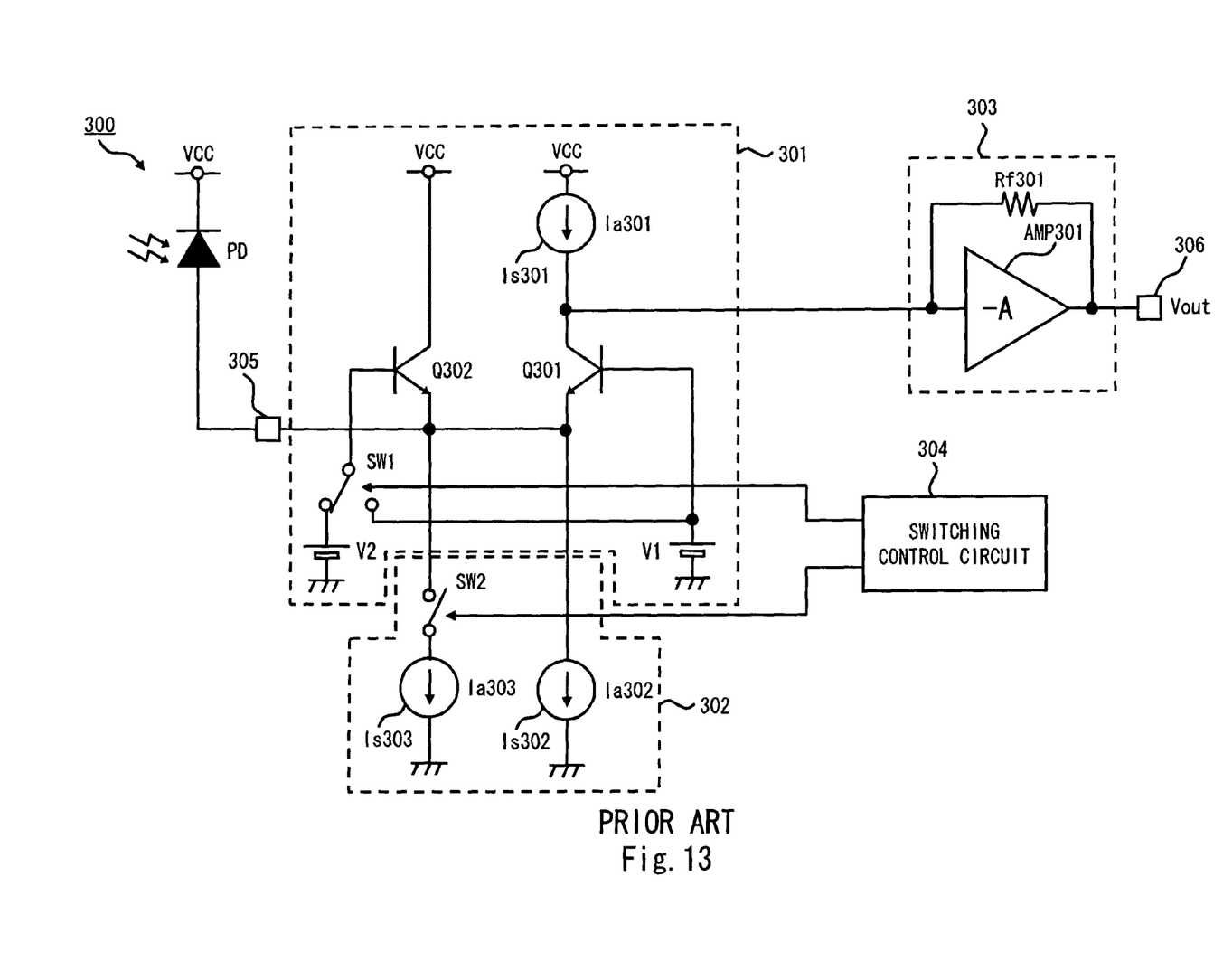
FIG. 13 is a circuit diagram of the light receiving circuit according to a third related art.

As an example of the light receiving circuit, a light receiving circuit 300 shown in FIG. 13 is suggested in Japanese Unexamined Patent Application Publication No. 2002-217649 (hereinafter referred to as third related art). The light receiving circuit 300 includes a switching circuit 301, a current source 302, a current voltage conversion circuit 303, a switching control circuit 304, and a photo diode PD. In the light receiving circuit 300, a current source Is301 of the switching circuit 301 and a current source Is302 of the current source 302 are connected in series, and two current sources are provided so as to output the same current amount. Therefore, the current output from the switching circuit 301 becomes the difference between the current flowing in an output point of the switching circuit 301 and the current output from the output point of the switching circuit 301. In other words, if other current does not flow into the connecting point of the current source Is301 and the current source Is302, current output from the switching circuit 301 becomes zero. The light receiving circuit 300 connects the photo diode PD to the wiring connecting the current source Is301 and the current source Is302 in the switching circuit 301. Therefore, the switching circuit 301 outputs the current output from the photo diode PD. Further, the light receiving circuit 300 includes a switch SW1 in the switching circuit 301 and a switch SW2 in the current source 302. Then the current amount flowing in the transistor Q301 is switched by connecting the switch SW1 to the voltage source V2 side. The current amount output from the photo diode PD is reduced by turning the switch SW2 on. In summary, the switches SW1 and SW2 are able to switch current amount output from the switching circuit 301 out of the current output from the photo diode PD.

However, in the third related art, the current source Is301 is connected to the power supply terminal VCC and the current source Is302 is connected to the ground terminal GND. In such a case, the current source Is301 is typically formed by a PNP transistor and the current source Is302 is formed by an NPN transistor. In such a configuration, the NPN transistor and the PNP transistor are formed by different semiconductors and have different variations. Even if the current source Is301 and the current source Is302 are set to output the same current amount, the current amounts output from these current sources are not substantially the same. Therefore, it is impossible to eliminate offset of the current output from the switching circuit 301, and the output voltage output from the current voltage conversion circuit 303 also has the offset. Further, in the third related art, the switching circuit switches the current amount output from the switching circuit 301, which makes it impossible to set successive switching width.

In the first to third related arts above, there is a problem that the characteristic of the amplification circuit changes according to the switching of the gain. There is another problem that the offset amount of the output voltage of the light receiving circuit cannot be decreased.

SUMMARY

A light receiving circuit according to one embodiment of the present invention includes a current control voltage generation circuit outputting first and second control voltages, a first current adjusting circuit having a first current source and generating a first output current by regulating a first input current depending on a voltage difference of the first and second control voltages, the first input current generated by adding current output from the first current source and input current output from a photo diode, a second current adjusting circuit having a second current source and generating a second output current by regulating a second input current output from the second current source depending on the voltage difference of the first and second control voltages, and a current voltage conversion circuit generating a first output voltage by converting the first output current to voltage based on a predetermined first resistance and generating a second output voltage by converting the second output current to voltage based on a predetermined second resistance.

According to the light receiving circuit of the present invention, both of the first and second current sources have a constant current component regardless of the output current of the photo diode. The first input current has an output current component of the photo diode. In summary, an offset voltage component included in the first output voltage and the second output voltage output from the current voltage conversion circuit is generated based on the component having the same value. Therefore, the voltage value due to the current component output from the photo diode is output as the difference voltage between the first output voltage and the second output voltage. Therefore, the light receiving circuit according to the present invention is able to cancel offset depending on the setting.

Further, according to the light receiving circuit of the present invention, in the first current adjusting circuit and the second current adjusting circuit, the gain is changed by regulating the current amount of the first output current and the current amount of the second output current based on the first and second control voltages. In summary, the first resistance and the second resistance of the current voltage conversion circuit are constant regardless of the gain. Thus, it is possible to attain substantially the constant frequency characteristic of the light receiving circuit of the present invention regardless of the gain.

According to the light receiving circuit of the present invention, it is possible to realize decrease in the output offset voltage and stable frequency characteristic.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
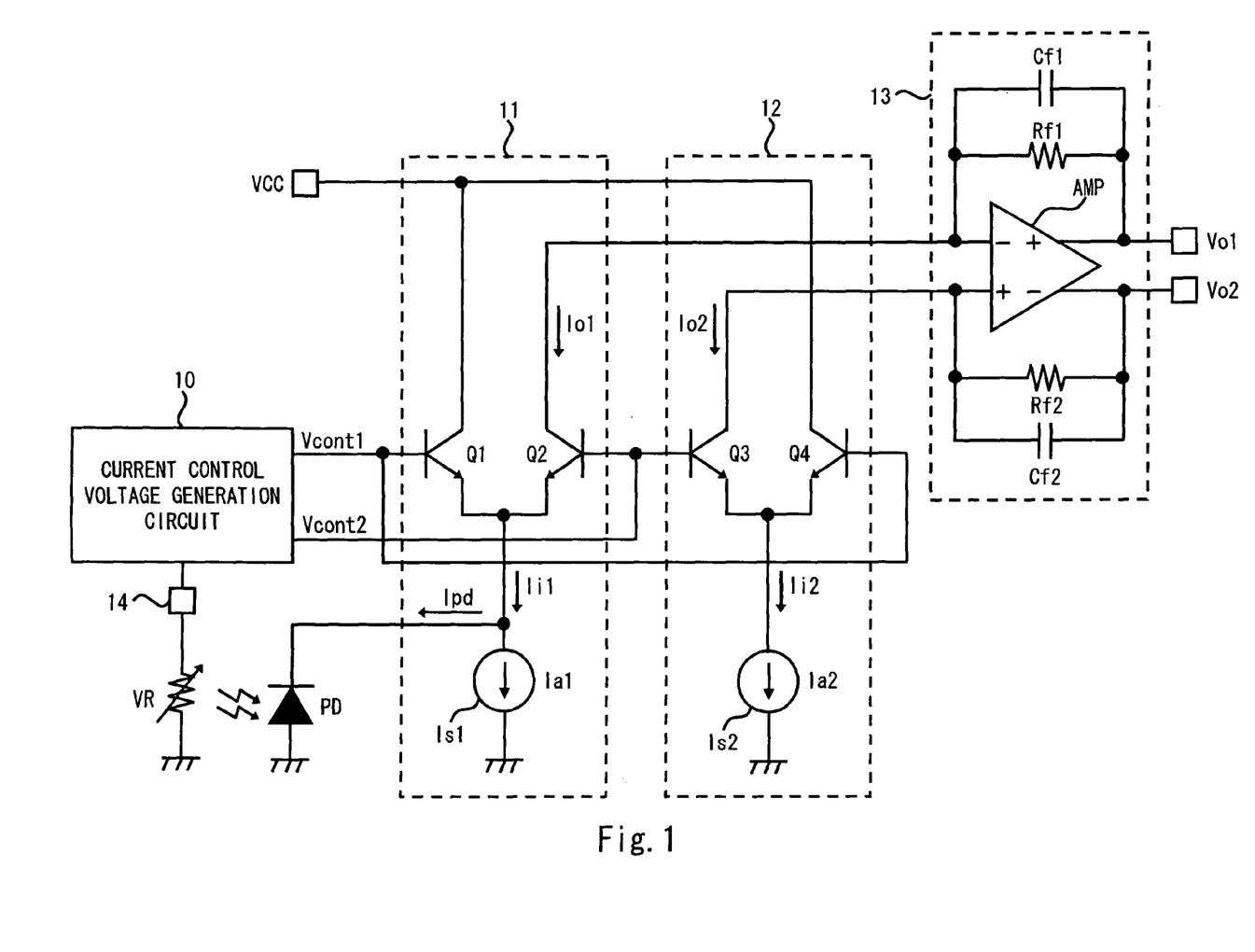
FIG. 1 shows a circuit diagram of a light receiving circuit according to a first embodiment.

The present embodiment of the invention will be described hereinafter with reference to the drawings. FIG. 1 shows a circuit diagram of a light receiving circuit 1 according to the first embodiment. As shown in FIG. 1, the light receiving circuit 1 includes a current control voltage generation circuit 10, a first current adjusting circuit 11, a second current adjusting circuit 12, a current voltage conversion circuit 13, and a photo diode PD.

The current control voltage generation circuit 10 is connected to an external terminal 14, and sets voltage values of first and second control voltages (for example, current control voltages Vcont1 and Vcont2) based on a voltage value of the external terminal 14. In the present embodiment, a variable resistor VR is connected between the external terminal 14 and the ground terminal GND. Then current flows in the variable resistor VR to generate voltage in the external terminal 14. The current control voltage generation circuit 10 will be described in detail below.

The first current adjusting circuit 11 includes NPN transistors Q1 and Q2 and a first current source Is1. The NPN transistors Q1 and Q2 form a first differential pair. The first current source Is1 is connected between a common connecting point of an emitter terminal of the NPN transistors Q1 and Q2 and the ground terminal GND. A cathode terminal of the photo diode PD is connected to a node between the first current source Is1 and the common connecting point of the first differential pair. The first current source Is1 outputs a first reference current Ia1, and current generated by adding the first reference current Ia1 and an output current Ipd of the photo diode PD is a first input current Ii1. The first input current Ii1 is supplied to the first differential pair. A collector of the NPN transistor Q1 is connected to a power supply terminal VCC. The current control voltage Vcont1 is supplied to a base of the NPN transistor Q1. A collector of the NPN transistor Q2 is the output terminal of the first current adjusting circuit 11 and outputs the first output current Io1 to the current voltage conversion circuit 13. The current control voltage Vcont2 is supplied to a base of the NPN transistor Q2.

The second current adjusting circuit 12 includes NPN transistors Q3 and Q4 and a second current source Is2. The NPN transistors Q3 and Q4 form a second differential pair. The second current source Is2 is connected between a common connecting point of an emitter terminal of the NPN transistors Q3 and Q4 and the ground terminal GND. The second current source Is2 outputs a second reference current Ia2 that functions as a second input current Ii2. The second input current Ii2 is supplied to the second differential pair. A collector of the NPN transistor Q3 is the output terminal of the first current adjusting circuit 11 and outputs the second output current Io2 to the current voltage conversion circuit 13. The current control voltage Vcont2 is supplied to a base of the NPN transistor Q3. A collector of the NPN transistor Q4 is connected to the power supply terminal VCC. The current control voltage Vcont1 is supplied to a base of the NPN transistor Q4.

The current voltage conversion circuit 13 includes an amplification circuit AMP, a first resistor Rf1, a second resistor Rf2, and feedback capacitors Cf1 and Cf2. The amplification circuit AMP has two inputs and two outputs. The first output current Io1 is input to the inverting input terminal of the amplification circuit AMP and the second output current Io2 is input to the non-inverting input terminal of the amplification circuit AMP. The first resistor Rf1 is connected between the inverting input terminal and the non-inverting output terminal. The second resistor Rf2 is connected between the non-inverting input terminal and the inverting output terminal. The amplification circuit AMP amplifies the difference component of the signals input to the inverting input terminal and the non-inverting input terminal based on the first resistor Rf1 and the second resistor Rf2. Thus, the first output voltage Vo1 is output from the non-inverting output terminal of the amplification circuit AMP and the second output voltage Vo2 is output from the inverting output terminal of the amplification circuit AMP. The feedback capacitor Cf1 is connected to the first resistor Rf1 in parallel and the feedback capacitor Cf2 is connected to the second resistor Rf2 in parallel. The feedback capacitors Cf1 and Cf2 may include parasitic capacitor of the circuit.

Figure 2:
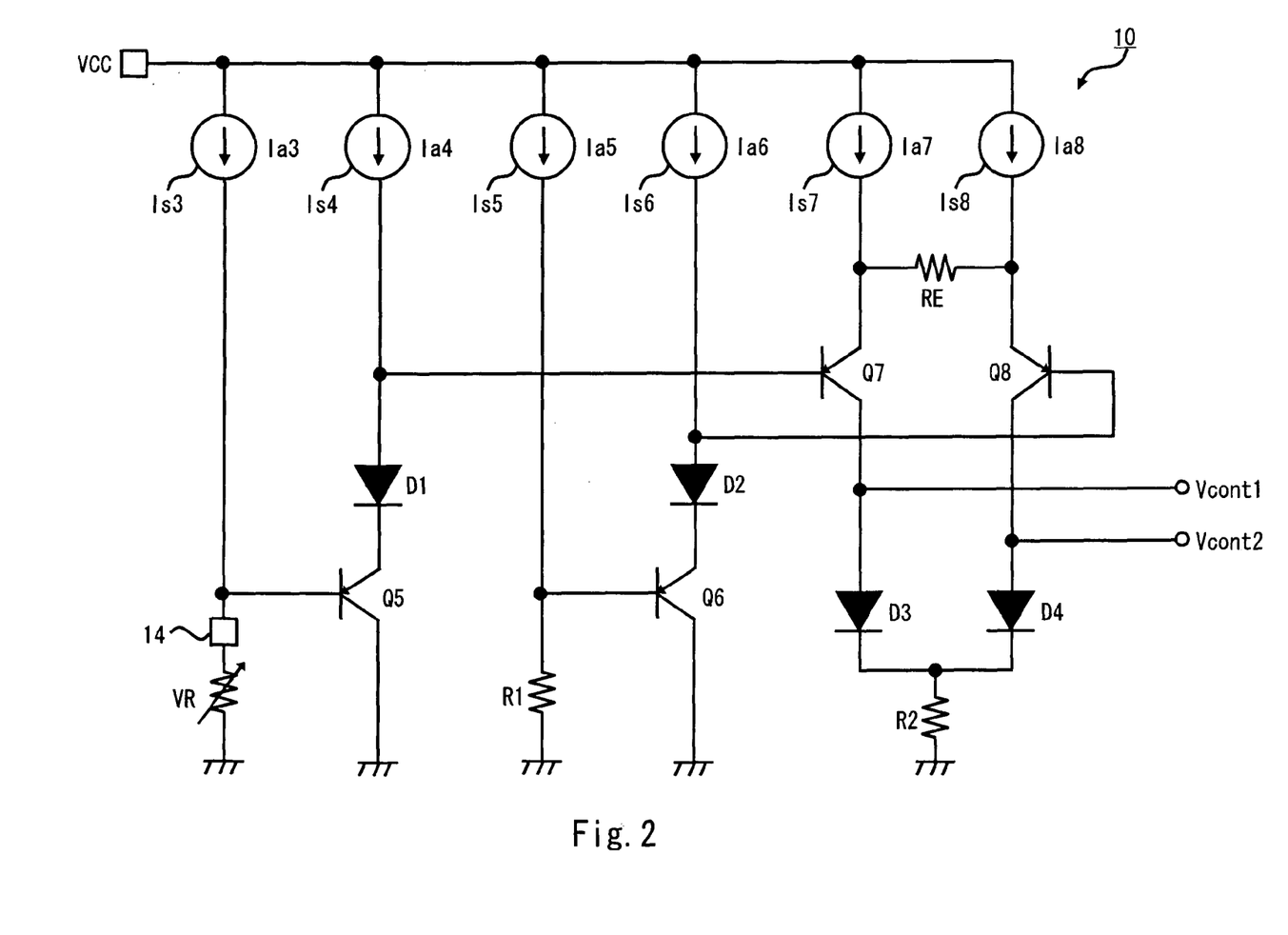
FIG. 2 shows a circuit diagram of a current control voltage generation circuit according to the first embodiment.

Now, the current control voltage generation circuit 10 will be described in detail. FIG. 2 shows a circuit diagram of the current control voltage generation circuit 10. As shown in FIG. 2, the current control voltage generation circuit 10 includes a third current source Is3 to an eighth current source Is8, diodes D1 to D4, PNP transistors Q5 to Q8, and resistors R1, R2, and RE.

One terminal of the third current source Is3 is connected to the power supply terminal VCC and the other terminal of the third current source Is3 is connected to the external terminal 14. The variable resistor VR is connected between the external terminal 14 and the ground terminal GND. One terminal of the fourth current source Is4 is connected to the power supply terminal VCC and the other terminal of the fourth current source Is4 is connected to an anode of the diode D1. A cathode of the diode D1 is connected to the emitter of the PNP transistor Q5. The collector of the PNP transistor Q5 is connected to the ground terminal GND. The base of the PNP transistor Q5 is connected to the external terminal 14.

One terminal of the fifth current source Is5 is connected to the power supply terminal VCC and the other terminal of the fifth current source Is5 is connected to one terminal of the resistor R1. The other terminal of the resistor R1 is connected to the ground terminal GND. One terminal of the sixth current source Is6 is connected to the power supply terminal VCC and the other terminal of the sixth current source Is6 is connected to an anode of the diode D2. A cathode of the diode D2 is connected to the emitter of the PNP transistor Q6. The collector of the PNP transistor Q6 is connected to the ground terminal GND. The base of the PNP transistor Q6 is connected to one terminal of the resistor R1.

One terminal of the seventh current source Is7 is connected to the power supply terminal VCC and the other terminal of the seventh current source Is7 is connected to the emitter of the PNP transistor Q7. The collector of the PNP transistor Q7 is connected to an anode of the diode D3. The base of the PNP transistor Q7 is connected to the anode of the diode D1. One terminal of the eighth current source Is8 is connected to the power supply terminal VCC and the other terminal of the eighth current source Is8 is connected to the emitter of the PNP transistor Q8. The collector of the PNP transistor Q8 is connected to an anode of the diode D4. The base of the PNP transistor Q8 is connected to the anode of the diode D2. Cathodes of the diodes D3 and D4 are connected in common and the resistor R2 is connected between the common connecting point of the diodes D3 and D4 and the ground terminal GND. The resistor RE connects the emitter of the PNP transistor Q7 and the emitter of the PNP transistor Q8. The current control voltage Vcont1 is output from the anode of the diode D3 and the current control voltage Vcont2 is output from the anode of the diode D4.

It is preferable to set the current values of the third current source Is3 to eighth current source Is8 as follows in the current control voltage generation circuit 10. The current values of the third current source Is3 and the fifth current source Is5 are made substantially the same, the current values of the fourth current source Is4 and the sixth current source Is6 are made substantially the same, and the current values of the seventh current source Is7 and the eighth current source Is8 are made substantially the same. If the resistance values of the resistor R1 and the variable resistor VR are the same, the base voltage of the PNP transistor Q5 and the base voltage of the PNP transistor Q6 are the same. The base voltages of the PNP transistors Q7 and Q8 are the same as well. Therefore, the voltage value generated at the diodes D3 and D4 are the same and the current control voltages Vcont1 and Vcont2 have the same voltage value. When the voltage values of the current control voltages Vcont1 and Vcont2 are changed, it is easy to set the voltage values of the current control voltages Vcont1 and Vcont2 based on the ratio of the resistance values of the resistor R1 to the variable resistor VR. For example, if the resistance value of the variable resistor VR is made larger than the resistance value of the resistor R1, the current control voltage Vcont1 becomes smaller than the current control voltage Vcont2. On the other hand, if the resistance value of the variable resistor VR is made smaller than the resistance value of the resistor R1, the current control voltage Vcont1 becomes larger than the current control voltage Vcont2.

Now, a behavior of the light receiving circuit 1 according to the present embodiment will be described. In this description, it is assumed that the first reference current Ia1 and the second reference current Ia2 have the same current amount and the first resistor Rf1 and the second resistor Rf2 have the same resistance value for the sake of simplicity. First, as a first behavior, the description will be made on the case where the current control voltages Vcont1 and Vcount2 are the same value. In such a case, each of the current flowing in the NPN transistors Q1 and Q2 is the half of the first input current Ii1. Therefore, the first output current Io1 can be expressed by an expression (1).

$$Io1=(Ii1)/2=(Ia1+Ipd)/2 \tag{1}$$

Each of the current flowing in the NPN transistors Q3 and Q4 are half of the second input current Ii2. Therefore, the second output current Io2 can be expressed by an expression (2).

$$Io2=(Ii2)/2=(Ia2)/2 \tag{2}$$

The first output current Io1 and the second output current Io2 are converted to the first output voltage Vo1 and the second output voltage Vo2 in the current voltage conversion circuit 13, respectively. In such a case, the current voltage conversion circuit 13 cancels the common component of the first output current Io1 and the second output current Io2. In summary, the component due to the first reference current Ia1 and the second reference current Ia2 having the same current amount are canceled. Therefore, the first output voltage Vo1 and the second output voltage Vo2 are expressed in expressions (3) and (4).

$$Vo1=+\{Rf1*(Ipd/2)\}/2 \tag{3}$$

$$Vo2=-\{Rf2*(Ipd/2)\}/2 \tag{4}$$

The first resistor RF1 and the second resistor Rf2 have the same resistance value. Therefore, the expressions (3) and (4) can be transformed and expressed by expressions (5) and (6).

$$Vo1=+\{Rf1*(Ipd/2)\}/2 \tag{5}$$

$$Vo2=-\{Rf1*(Ipd/2)\}/2 \tag{6}$$

The receiving circuit (not shown) corresponding to the light receiving circuit 1 of the present embodiment receives the first output voltage Vo1 and the second output voltage Vo2 as the differential signal. Therefore, the input voltage Vi in the receiving circuit is expressed by an expression (7).

$$\begin{aligned} Vi &= Vo1 - Vo2 \\ &= +\{Rf1*(Ipd/2)\}/2 - [-\{Rf1*(Ipd/2)\}/2] \\ &= Rf1*Ipd/2 \end{aligned} \tag{7}$$

In summary, the voltage component due to the first reference current Ia1 and the second reference current Ia2 is canceled to each other if the first reference current Ia1 and the second reference current Ia2 have the same current amount and the first resistor Rf1 and the second resistor Rf2 have the same resistance value. The receiving circuit only receives the voltage component (Rf1*Ipd/2 in the expression (7)) due to the current Ipd output from the photo diode PD as the control signal.

Now, as a second behavior, the description will be made on the case where the current control voltage Vcont1 is smaller than the current control voltage Vcont2. In such a case, the current flowing in the NPN transistor Q1 is smaller than the current flowing in the NPN transistor Q2. As an example, the description will be made on the case where the ratio of the current flowing in the NPN transistor Q1 to the current flowing in the NPN transistor Q2 is 1:3. In such a case, the first output current Io1 can be expressed by an expression (8).

$$Io1=(Ii1)*3/4=(Ia1+Ipd)*3/4 \tag{8}$$

Further, the current flowing in the NPN transistor Q3 is larger than the current flowing in the NPN transistor Q4. In such a case, the ratio of the current flowing in the NPN transistor Q3 to the current flowing in the NPN transistor Q4 is 3:1. Therefore, the second output current Io2 can be expressed by an expression (9).

$$Io2=(Ii2)*3/4=(Ia2)*3/4 \tag{9}$$

The first output current Io1 and the second output current Io2 are converted to the first output voltage Vo1 and the second output voltage Vo2 in the current voltage conversion circuit 13, respectively. In such a case, the current voltage conversion circuit 13 cancels the common component of the first output current Io1 and the second output current Io2. In summary, the component due to the first reference current Ia1 and the second reference current Ia2 having the same current amount are canceled. Therefore, the first output voltage Vo1 and the second output voltage Vo2 are expressed in expressions (10) and (11).

$$Vo1=+\{Rf1*(3Ipd/4)\}/2 \tag{10}$$

$$Vo2=-\{Rf2*(3Ipd/4)\}/2 \tag{11}$$

Now, the first resistor Rf1 and the second resistor Rf2 have the same resistance value. Therefore, the expressions (10) and (11) can be transformed and expressed by expressions (12) and (13).

$$Vo1=+\{Rf1*(3Ipd/4)\}/2 \tag{12}$$

$$Vo2=-\{Rf1*(3Ipd/4)\}/2 \tag{13}$$

Therefore, the input voltage Vi in the receiving circuit can be expressed by an expression (14).

$$Vi = Vo1 - Vo2 \quad (14)$$
$$= +\{Rf1*(3Ipd/4)\}/2 - [-\{Rf1*(3Ipd/4)\}/2]$$
$$= Rf1*3Ipd/4$$

In summary, the voltage component due to the first reference current Ia1 and the second reference current Ia2 is canceled to each other if the first reference current Ia1 and the second reference current Ia2 have the same current amount and the first resistor Rf1 and the second resistor Rf2 have the same resistance value. Therefore, the light receiving circuit 1 is able to cancel the offset voltage regarding the output voltage. The receiving circuit only receives the voltage component (Rf1*Ipd*3/4 in the expression (14)) due to the current Ipd output from the photo diode PD as the control signal. When the values of the expressions (7) and (14) are compared, it can be seen that the value of the expression (14) is larger. Therefore, when the current control voltage Vcont1 is smaller than the current control voltage Vcont2, the light receiving circuit 1 increases the gain of the circuit.

Now, as a third behavior, the description will be made on the case where the current control voltage Vcont1 is larger than the current control voltage Vcont2. In such a case, the current flowing in the NPN transistor Q1 is larger than the current flowing in the NPN transistor Q2. As an example, the description will be made on the case where the ratio of the current flowing in the NPN transistor Q1 to the current flowing in the NPN transistor Q2 is 3:1. In such a case, the first output current Io1 can be expressed by an expression (15).

$$Io1=(Ii1)*1/4=(Ia1+Ipd)*1/4 \quad (15)$$

Further, the current flowing in the NPN transistor Q3 is smaller than the current flowing in the NPN transistor Q4. In such a case, the ratio of the current flowing in the NPN transistor Q3 to the current flowing in the NPN transistor Q4 is 1:3. Therefore, the second output current Io2 can be expressed by an expression (16).

$$Io2=(Ii2)*1/4=(Ia2)*1/4 \quad (16)$$

The first output current Io1 and the second output current Io2 are converted to the first output voltage Vo1 and the second output voltage Vo2 in the current voltage conversion circuit 13, respectively. In such a case, the current voltage conversion circuit 13 cancels the common component of the first output current Io1 and the second output current Io2. In summary, the component due to the first reference current Ia1 and the second reference current Ia2 having the same current amount are canceled. Therefore, the first output voltage Vo1 and the second output voltage Vo2 are expressed in expressions (17) and (18).

$$Vo1=+\{Rf1*(Ipd/4)\}/2 \quad (17)$$

$$Vo2=-\{Rf2*(Ipd/4)\}/2 \quad (18)$$

Because the first resistor Rf1 and the second resistor Rf2 have the same resistance value, the expressions (17) and (18) can be transformed and expressed by expressions (19) and (20).

$$Vo1=+\{Rf1*(Ipd/4)\}/2 \quad (19)$$

$$Vo2=-\{Rf1*(Ipd/4)\}/2 \quad (20)$$

Therefore, the input voltage Vi in the receiving circuit can be expressed by an expression (21).

$$Vi = Vo1 - Vo2 \quad (21)$$
$$= +\{Rf1*(Ipd/4)\}/2 - [-\{Rf1*(Ipd/4)\}/2]$$
$$= Rf1*Ipd/4$$

In summary, the voltage component due to the first reference current Ia1 and the second reference current Ia2 is canceled to each other if the first reference current Ia1 and the second reference current Ia2 have the same current amount and the first resistor Rf1 and the second resistor Rf2 have the same resistance value. Therefore, the light receiving circuit 1 is able to cancel the offset voltage regarding the output voltage. The receiving circuit only receives the voltage component (Rf1*Ipd*1/4 in the expression (21)) due to the current Ipd output from the photo diode PD as the control signal. When the values of the expressions (7) and (21) are compared, it can be seen that the value of the expression (21) is smaller. Therefore, when the current control voltage Vcont1 is larger than the current control voltage Vcont2, the light receiving circuit 1 decreases the gain of the circuit.

Figure 3:
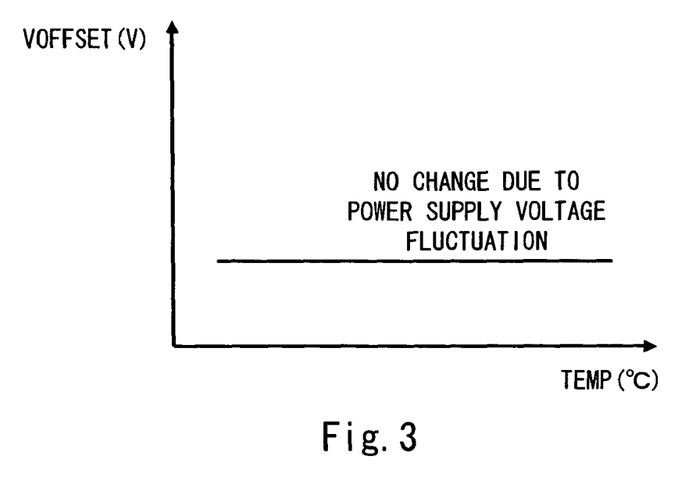
FIG. 3 is a graph showing a characteristic of an output offset voltage of the light receiving circuit according to the first embodiment.

Now, the power supply voltage dependency fluctuation and the temperature dependency fluctuation of the output offset voltage Voffset in the light receiving circuit 1 according to the first embodiment will be described. FIG. 3 shows a graph showing the power supply voltage dependency and the temperature dependency of the output offset voltage Voffset of the light receiving circuit 1. As shown in FIG. 3, the output offset voltage Voffset of the light receiving circuit 1 has no sensitivity to the fluctuation of the power supply voltage and to the temperature fluctuation. One reason for this is that both the first current source Is1 and the second current source Is2 function based on the same voltage (ground voltage in the present embodiment), are formed by the transistors having the same conductivity, and have a configuration for outputting the same current. Another reason is that the voltage differences of both ends of the first and second current sources are the same because the first and second differential pairs are formed in the same circuit configuration and the first and second differential pairs function based on the same control voltage. By forming the first current source Is1 and the second current source Is2 as stated above, the current output from the first current source Is1 and the second current source Is2 indicates the same fluctuation to the fluctuation factor even when the fluctuation is occurred in the power supply voltage or the temperature.

As stated above, the light receiving circuit 1 according to the present embodiment includes the first current adjusting circuit 11 and the second current adjusting circuit 12, both of which outputting substantially the same current if there is no current output from the photo diode PD. Then the output voltage without offset is output by carrying out current/voltage conversion on the current output from the first current adjusting circuit 11 and the second current adjusting circuit 12 by using the amplification circuit having two inputs and two outputs. Then the current generated by the photo diode PD according to the receiving amount is input to the first current adjusting circuit 11. Therefore, the voltage signal corresponding to the current component generated by the photodiode PD is added to the first output voltage Vo1. In the receiving circuit, it is possible to receive the control signal corresponding to the current generated by the photo diode PD by receiving the first output voltage Vo1 and the second output voltage Vo2 as the differential signal. Note that the receiving circuit is able to cancel the noise that is mixed in the wiring that extends from the light receiving circuit 1 to the receiving circuit by receiving the signal from the light receiving circuit 1 as the differential signal.

Further, the first differential pair of the first current adjusting circuit 11 and the second differential pair of the second current adjusting circuit 12 have substantially the same characteristic, and the transistor forming these differential pairs are controlled by the current control voltages Vcont1 and Vcont2. Thus, the first output current Io1 and the second output current Io2 fluctuate in substantially the same fluctuation rate to the fluctuation of the voltage difference of the current control voltages Vcont1 and Vcont2. Therefore, it is possible to vary the signal level of the control signal depending on the component of the current Ipd generated by the photo diode PD added to the first output voltage Vo1 side while canceling the output offset voltage Voffset. Therefore, it is possible to change the gain of the circuit without changing the resistance values of the first resistance Rf1 and the second resistance Rf2 of the current voltage conversion circuit 13. Thus, it is possible for the light receiving circuit 1 to output the constant signals without changing the frequency characteristic of the output signal determined by the first resistance Rf1 and the second resistance Rf2 and the feedback capacities Cf1 and Cf2 depending on the gain.

Further, the light receiving circuit 1 is able to successively change the current control voltages Vcont1 and Vcont2 depending on the resistance value of the external variable resistor VR. Therefore, the light receiving circuit 1 is able to successively change the gain of the circuit.

Second Embodiment

Figure 4:
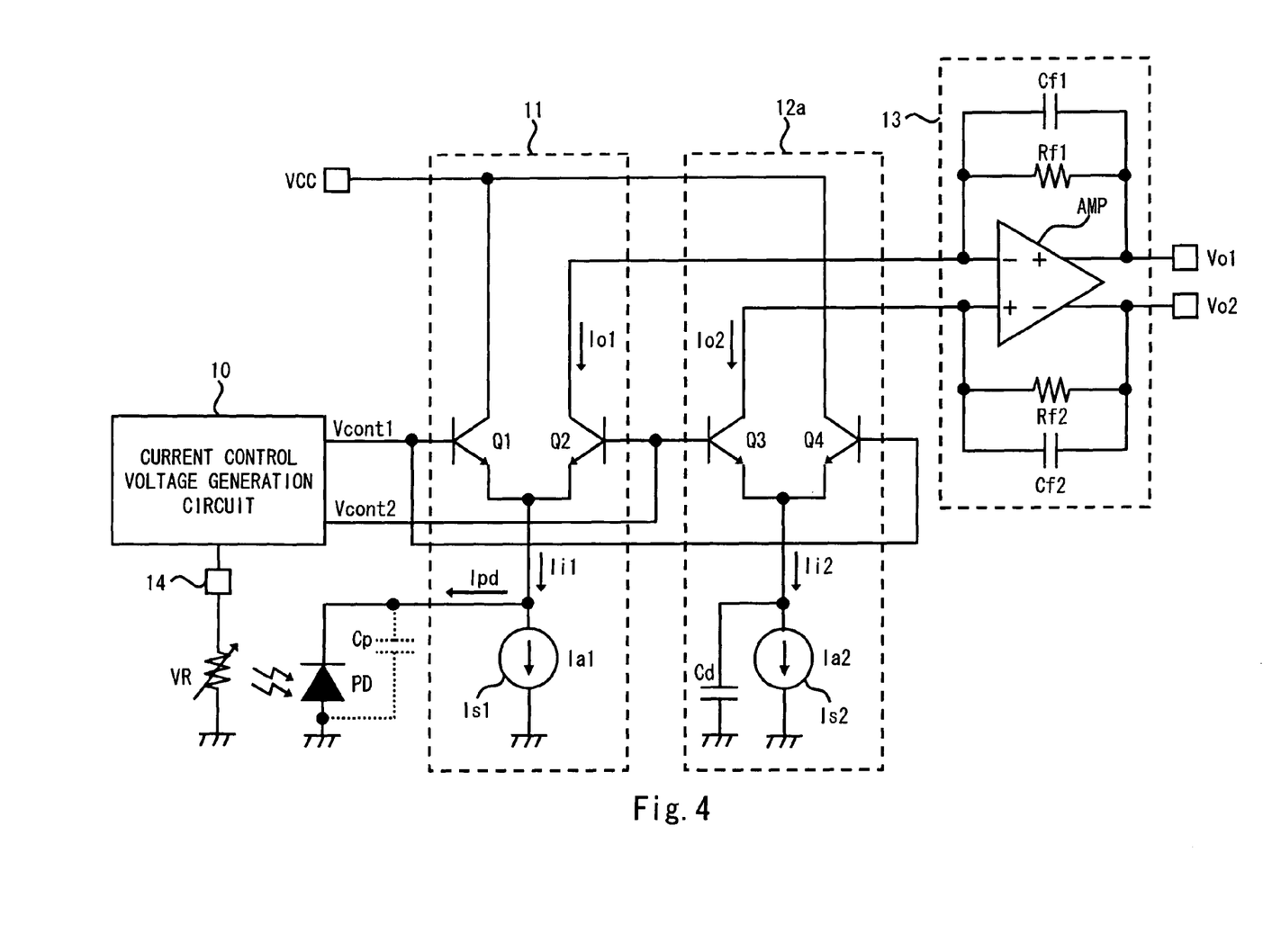
FIG. 4 is a circuit diagram of the light receiving circuit according to a second embodiment.

A circuit diagram of the light receiving circuit 2 according to the second embodiment is shown in FIG. 4. As shown in FIG. 4, the light receiving circuit 2 includes a second current adjusting circuit 12a in which a dummy capacitor Cd is connected to the second current source Is2 of the light receiving circuit 1 of the first embodiment in parallel. The dummy capacitor Cd has substantially the same capacity to the junction capacitor Cp of the photo diode PD.

By adding the dummy capacitor Cd in the light receiving circuit 2, the first current adjusting circuit 11 including the junction capacitor Cp has the symmetrical circuit configuration to the second current adjusting circuit 12a. In summary, it is possible to cancel the noise generated due to the junction capacitor Cp by current flowing in the dummy capacitor Cd. Therefore, in the light receiving circuit 2, it is possible to output the control signal depending on the current Ipd having less noise than in the light receiving circuit 1.

Third Embodiment

Figure 5:
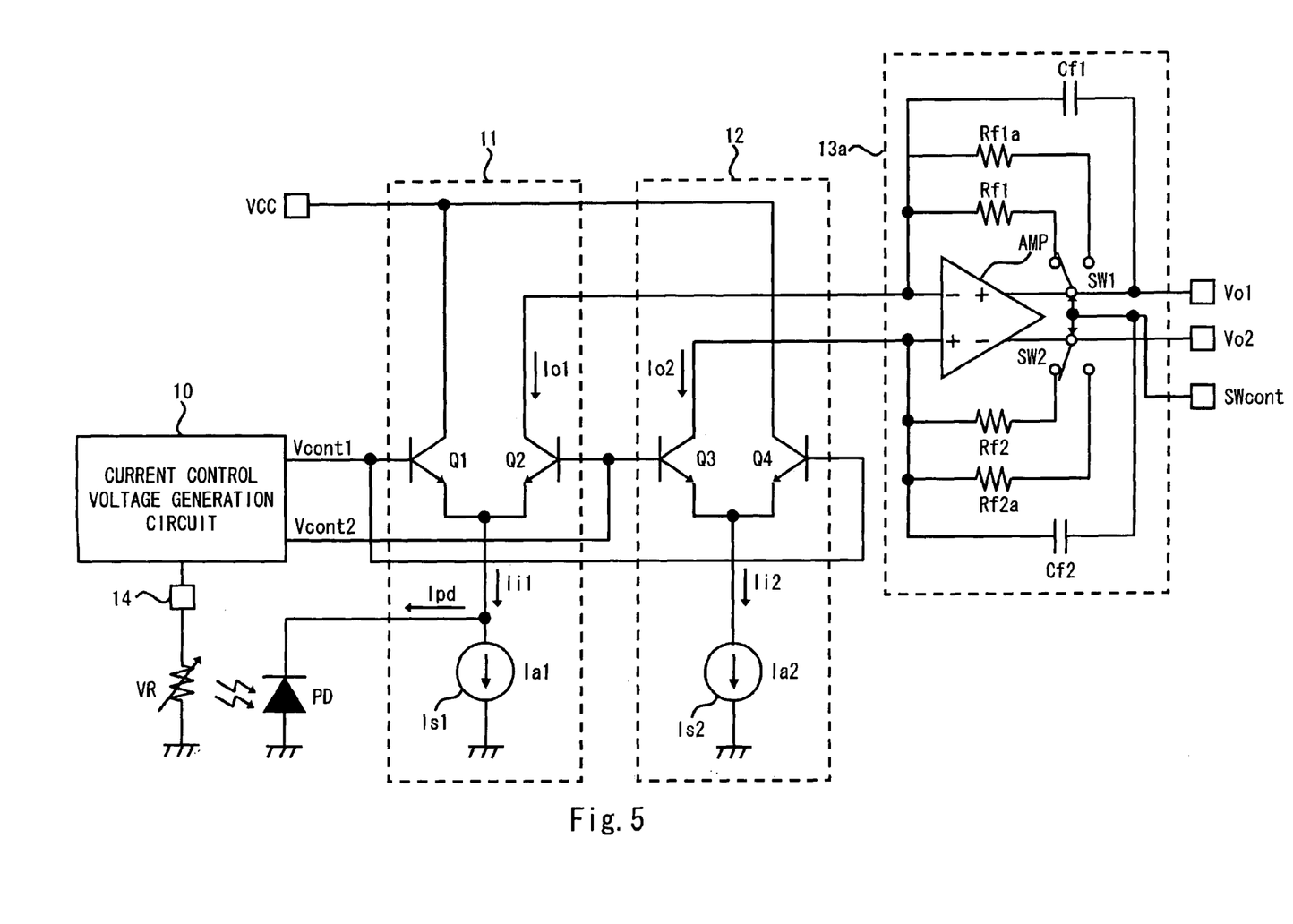
FIG. 5 is a circuit diagram of the light receiving circuit according to a third embodiment.

FIG. 5 shows a circuit diagram of the light receiving circuit 3 according to the third embodiment. As shown in FIG. 5, the light receiving circuit 3 includes a current voltage conversion circuit 13a connecting a third resistor Rf1a to the first resistor Rf1 in parallel and connecting a fourth resistor Rf2a to the second resistor Rf2 in parallel of the light receiving circuit 1 according to the first embodiment. The current voltage conversion circuit 13a further includes a first switch SW1 selecting one of the first resistor Rf1 and the third resistor Rf1a and a second switch SW2 selecting one of the second resistor Rf2 and the fourth resistor Rf2a. The first switch SW1 and the second switch SW2 switch the resistors based on the control signal output from the switch control terminal SWcont.

In the light receiving circuit 3, the gain out of range that can be regulated by the first current adjusting circuit 11 and the second current adjusting circuit 12 can be set by providing the third resistor Rf1a, the fourth resistor Rf2a, the first switch SW1, and the second switch SW2. For example, when the resistance values of the third resistor Rf1a and the fourth resistor Rf2a are made larger than the resistance values of the first resistor Rf1 and the second resistor Rf2, it is possible to obtain the output signal whose amplitude is larger than in the case where the first resistor Rf1 and the second resistor Rf2 are used by using the third resistor Rf1a and the fourth resistor Rf2a. Therefore, it is possible to increase flexibility of the light receiving circuit 3 in setting the gain compared with the light receiving circuit 1. By this flexibility, even when the laser diodes for CDs and for DVDs have different variations to each other, for example, it is possible to correspond the two resistors to the two laser diodes and to use them depending on the applications.

It is apparent that the present invention is not limited to the above embodiment, but may be modified and changed without departing from the scope and spirit of the invention. For example, even if the conductivity type of the transistor forming a circuit is changed, the above-described circuit configuration still can be realized.

What is claimed is:

1. A light receiving circuit comprising:
   a current control voltage generation circuit outputting first and second control voltages;
   a first current adjusting circuit having a first current source and generating a first output current by regulating a first input current depending on a voltage difference of the first and second control voltages, the first input current generated by adding current output from the first current source and input current output from a photo diode;
   a second current adjusting circuit having a second current source and generating a second output current by regulating a second input current output from the second current source depending on the voltage difference of the first and second control voltages; and
   a current voltage conversion circuit generating a first output voltage by converting the first output current to voltage based on a predetermined first resistance and generating a second output voltage by converting the second output current to voltage based on a predetermined second resistance.

2. The light receiving circuit according to claim 1, wherein the first current adjusting circuit includes a first differential pair to which the first input current is input in a common connecting point of two transistors, and the second current adjusting circuit includes a second differential pair to which the second input current is input in a common connecting point of two transistors.

3. The light receiving circuit according to claim 2, wherein the transistor forming the first differential pair and outputting the first output current and the transistor forming the second differential pair and outputting the second output current function based on the second control voltage.

4. The light receiving circuit according to claim 1, wherein the first current source and the second current source output current having substantially the same value.

5. The light receiving current according to claim 1, wherein the current control voltage generation circuit is connected to an external terminal and sets the first and second control voltages based on the voltage value of the external terminal.

6. The light receiving circuit according to claim 1, wherein the current control voltage generation circuit is connected to an external terminal and sets the first and second control voltages based on a resistance value of a variable resistor connected to the external terminal.

7. The light receiving circuit according to claim 1, wherein the second current source has a capacitor having substantially the same capacitance value to a junction capacitor of the photo diode connected in parallel.

8. The light receiving circuit according to claim 1, wherein the first resistor and the second resistor have substantially the same resistance value.

9. The light receiving circuit according to claim 1, wherein the current voltage conversion circuit includes a third resistor connected to the first resistor in parallel, a fourth resistor connected to the second resistor in parallel, a first switch selecting one of the first resistor and the third resistor, and a second switch selecting one of the second resistor and the fourth resistor.

* * * * *